United States Patent
Jung

(10) Patent No.: US 9,450,521 B2
(45) Date of Patent: Sep. 20, 2016

(54) ARRANGEMENT FOR DRIVING AND DRIVE METHOD FOR A PIEZOELECTRIC ACTUATOR

(75) Inventor: Uwe Jung, Wörth a. d. Donau (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 268 days.

(21) Appl. No.: 14/239,328

(22) PCT Filed: Aug. 20, 2012

(86) PCT No.: PCT/EP2012/066210
§ 371 (c)(1),
(2), (4) Date: Jul. 10, 2014

(87) PCT Pub. No.: WO2013/024179
PCT Pub. Date: Feb. 21, 2013

(65) Prior Publication Data
US 2014/0340001 A1    Nov. 20, 2014

(30) Foreign Application Priority Data
Aug. 18, 2011    (DE) .................. 10 2011 081 161

(51) Int. Cl.
*H01L 41/08* (2006.01)
*H02N 2/06* (2006.01)
(Continued)

(52) U.S. Cl.
CPC .......... *H02N 2/067* (2013.01); *F02D 41/2096* (2013.01); *H01L 41/257* (2013.01); *H02N 2/06* (2013.01); *H01L 41/083* (2013.01)

(58) Field of Classification Search
CPC ..... B06B 1/0607; B06B 1/0622; B06B 1/06; B06B 1/0644; F02D 41/2096; F02D 2041/2051; F02D 2041/2044; F02D 2250/16; F02D 41/2432; F02D 41/2467; F02M 51/0603; F02M 47/027; F02M 61/167; F02M 63/0026

USPC .......................................... 310/311; 318/116
See application file for complete search history.

(56) References Cited

U.S. PATENT DOCUMENTS

| 6,025,671 | A | * | 2/2000 | Boecking | ........... F02M 51/0603 |
| | | | | | 310/328 |
| 6,564,771 | B2 | | 5/2003 | Rueger et al. | ................ 123/299 |

(Continued)

FOREIGN PATENT DOCUMENTS

| DE | 19905340 A1 | 8/2000 | ............. F02D 41/20 |
| DE | 10016476 A1 | 12/2001 | ............. F02D 41/20 |

(Continued)

OTHER PUBLICATIONS

Chinese Office Action, Application No. 201280051366.0, 13 pages, Sep. 30, 2015.

(Continued)

*Primary Examiner* — Bentsu Ro
(74) *Attorney, Agent, or Firm* — Slayden Grubert Beard PLLC

(57) ABSTRACT

A method is disclosed for driving a piezoelectric actuator with a piezoelectric stack, which is operated as an actuating element of an injector. The piezoelectric stack is polarized during production by a polarization process initially with a first field strength, which results in a first length of the piezoelectric stack. According to the method, the piezoelectric stack is driven during operation at a second field strength, which is smaller than the first field strength, wherein a setpoint length for the piezoelectric stack is defined depending on the second field strength. In addition, a change in length caused by depolarization from the setpoint length of the piezoelectric stack is monitored. Then, when a predetermined threshold value for the change in length is reached, the piezoelectric stack is operated at a third field strength until the setpoint length for said piezoelectric stack is reached.

13 Claims, 1 Drawing Sheet

(51) Int. Cl.
*F02D 41/20* (2006.01)
*H01L 41/257* (2013.01)
*H01L 41/083* (2006.01)

(56) References Cited

U.S. PATENT DOCUMENTS

| | | | | |
|---|---|---|---|---|
| 6,747,377 B2* | 6/2004 | Ullakko | ................ | H01L 41/12 310/26 |
| 6,820,474 B2 | 11/2004 | Rueger et al. | ............. | 73/114.51 |
| 7,318,417 B2* | 1/2008 | Lang | ................... | F02M 47/027 123/467 |
| 7,334,329 B2* | 2/2008 | Goller | .................. | F02M 47/027 123/498 |
| 7,406,861 B2 | 8/2008 | Jung et al. | ................ | 73/114.45 |
| 7,617,813 B2 | 11/2009 | Pirkl et al. | ................... | 123/490 |
| 7,802,561 B2 | 9/2010 | Beilharz et al. | ............ | 123/498 |
| 8,082,903 B2 | 12/2011 | Lehr et al. | ................... | 123/490 |
| 2004/0149840 A1 | 8/2004 | Remmels et al. | ............ | 239/584 |
| 2010/0186718 A1* | 7/2010 | Klein | ................. | F02D 41/2096 123/472 |

FOREIGN PATENT DOCUMENTS

| | | | | |
|---|---|---|---|---|
| DE | 10024662 A1 | 12/2001 | ............ | F02D 41/20 |
| DE | 10033343 A1 | 1/2002 | ............ | F02D 41/20 |
| DE | 10129375 A1 | 1/2003 | ............ | F02M 47/02 |
| DE | 10356858 A1 | 7/2005 | ............ | F02D 41/20 |
| DE | 10360019 A1 | 7/2005 | ............ | F02D 35/02 |
| DE | 102004018211 A1 | 11/2005 | ............ | F02D 41/06 |
| DE | 102004046080 A1 | 4/2006 | ............ | F02D 41/20 |
| DE | 102004058971 A1 | 6/2006 | ............ | F02D 41/20 |
| DE | 102005015257 A1 | 10/2006 | ............ | F02D 41/20 |
| DE | 102006021299 A1 | 11/2007 | ............ | F02D 41/20 |
| DE | 102006058744 A1 | 6/2008 | ............ | F02D 41/20 |
| DE | 102007047657 B3 | 4/2009 | ............ | F02D 41/20 |
| DE | 102009046286 A1 | 5/2011 | ............ | F02D 41/20 |
| DE | 102009046424 A1 | 5/2011 | ............ | F02D 41/20 |
| EP | 1515377 A1 | 3/2005 | ............ | F02D 41/20 |
| WO | 2006/029931 A1 | 3/2006 | ............ | F02D 41/042 |
| WO | 2013/024179 A2 | 2/2013 | ......... | F02D 41/2096 |

OTHER PUBLICATIONS

International Search Report and Written Opinion, Application No. PCT/EP2012/066210, 9 pages, Mar. 8, 2013.

* cited by examiner

ARRANGEMENT FOR DRIVING AND DRIVE METHOD FOR A PIEZOELECTRIC ACTUATOR

CROSS-REFERENCE TO RELATED APPLICATIONS

This application is a U.S. National Stage Application of International Application No. PCT/EP2012/066210 filed Aug. 20, 2012, which designates the United States of America, and claims priority to DE Application No. 10 2011 081 161.3 filed Aug. 18, 2011, the contents of which are hereby incorporated by reference in their entirety.

TECHNICAL FIELD

The invention relates to a method for driving a piezoelectric actuator having a piezoelectric stack, which piezoelectric actuator is operated, in particular, as an actuating element for an injector. The invention also relates to an arrangement for driving a piezoelectric actuator of this kind.

BACKGROUND

A piezoelectric stack is a component which executes a mechanical movement as a result of an electrical voltage being applied. A piezoelectric stack comprises a plurality of material layers, which react to the application of an electric field, and a plurality of electrode layers, wherein each material layer is arranged between two of the electrode layers. The material layers are usually formed from ceramic.

The material of the material layers is ferroelectric and, during its production, is polarized in one electric field by being heated above the ferroelectric Curie temperature and then cooled down. This process during production is called a polarization process. The dipole moments (Weiss domains) which are initially oriented randomly are oriented substantially in parallel as a result.

Operating the piezo stack during regular operation at a field strength which is smaller than the field strength in a polarization process results, over the course of time, in a depolarization (return orientation) of the dipole moments, which are also called domains. The same effect occurs when the piezo stack is subjected to alternating temperatures, even if no electric field is applied. This effect leads to a change in length of the piezo stack.

In this connection, regular operation is understood to mean operation of the piezo stack under the conditions of its intended use. The intended use of the piezo stack may be, for example, the use within an actuator of a (fuel) injection valve—or: (fuel) injector, for example within a motor vehicle. In this case, regular operation is understood to mean normal (regular) operation of a vehicle When the piezo stack is used as an actuating element, for example as an operating element in injection valves of an extremely wide variety of types of engine for motor vehicles, this leads to a change in the zero point position. Therefore, an idle stroke, which can have an adverse effect on the functioning and/or efficiency of an engine, can occur when a piezo stack is used in an injection valve.

Particularly when said piezo stack is used as an actuating element for an injection valve (injector), the described effects lead to the dynamic variation in the change in length of the piezo stack having to be taken into account in order to ensure functional reliability of the injector. In order to be able to ensure a zero point position which results from a defined setpoint length of the piezo stack, hydraulic movement compensators or circuits, for example, are used, these allowing operation of the piezo stack with a reversed polarity. A further known variant detects the deviation between a change in length and corrects a length of the piezo stack which differs from the setpoint length by compensation of the idle time of the movement being compensated for by means of changed drive parameters.

SUMMARY

A method for driving a piezoelectric actuator, which has a piezo stack, for a fuel injector, wherein the piezo stack is a piezo stack which, during its production, is polarized by a polarization process initially at a first field strength, this resulting in a first length of the piezo stack, in which method the piezo stack is driven during regular operation at a second field strength which is smaller than the first field strength, wherein a setpoint length of the piezo stack is defined as a function of the second field strength; a change in length of the piezo stack, which change is caused by depolarization, as a function of the second field strength is monitored in comparison to the setpoint length of the piezo stack; when a prespecified threshold value for a change in length of the piezo stack of this kind as a function of the second field strength is reached, said piezo stack is operated at a third field strength until its setpoint length is reached.

In a further embodiment, the third field strength is greater than the second field strength.

In a further embodiment, the third field strength is greater than the first field strength.

In a further embodiment, the piezo stack, after the prespecified threshold value is reached, is continuously operated at the third field strength until the actual length of the piezo stack corresponds to the setpoint length.

In a further embodiment, the piezo stack is operated at the second field strength after its setpoint length is reached again.

In a further embodiment, the setpoint length, which prespecifies a starting position of the piezo stack without driving, is determined by an idle stroke detection method.

In a further embodiment, the change in length is determined by an idle stroke detection method.

Another embodiment provides an arrangement for driving a piezoelectric actuator comprising a piezoelectric actuator for a fuel injector comprising a piezo stack, wherein the piezo stack is a piezo stack which, during its production, is polarized by a polarization process initially at a first field strength, this resulting in a first length of the piezo stack, wherein the driving arrangement is designed: to drive the piezo stack during regular operation at a second field strength which is smaller than the first field strength, wherein a setpoint length of the piezo stack is defined as a function of the second field strength; to monitor a change in length of the piezo stack, which change is caused by depolarization, as a function of the second field strength in comparison to the setpoint length of the piezo stack; when a prespecified threshold value for a change in length of the piezo stack of this kind is reached, to operate said piezo stack at a third field strength until its setpoint length is reached.

In a further embodiment, the arrangement is further designed to continuously operate the piezo stack at the third field strength until the actual length of the piezo stack corresponds to the setpoint length.

In a further embodiment, the arrangement is further designed to operate the piezo stack at the second field strength after its setpoint length is reached again.

In a further embodiment, the arrangement is further designed to determine the setpoint length, which prespecifies a starting position of the piezo stack, and/or the change in length by a idle stroke detection method.

BRIEF DESCRIPTION OF THE DRAWINGS

Example embodiments of the invention are explained in greater detail below with reference to the drawings, in which.

DETAILED DESCRIPTION

Figure 1:
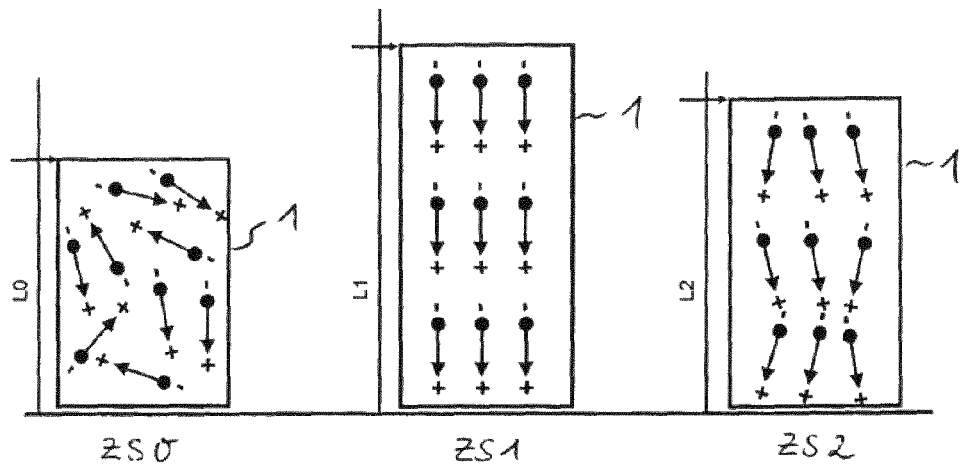
FIG. 1 shows an illustration of different lengths of a piezoelectric actuator having a piezo stack in different states.

Embodiments of the invention specify a way of driving a piezoelectric actuator in which a zero point position of the piezoelectric actuator can be achieved in a relatively simple manner.

Some embodiments provide a method for driving a piezoelectric actuator having a piezo stack, which is operated as an actuating element for an injector in particular, wherein the piezo stack is a piezo stack which, during its production, is polarized by a polarization process initially at a first field strength, this resulting in a first initial length of the piezo stack. In the method, the piezo stack is driven during regular operation, in particular during regular operation of a motor vehicle having a piezoelectric actuator of this kind and piezo stacks, at a second field strength which is smaller than the first field strength, wherein a setpoint length of the piezo stack is defined as a function of the second field strength. A deviation, which is caused by depolarization, from the setpoint length of the piezo stack during regular operation is monitored. When a prespecified threshold value for the change in length is reached, the piezo stack is operated at a third field strength until its setpoint length is reached.

Some embodiments provide an arrangement for driving a piezoelectric actuator for a fuel injector which has a piezo stack which is polarized by a polarization process, which took place during its production, initially at a first field strength, this resulting in a first length of the piezo stack. The driving arrangement is designed to drive the piezo stack during operation at a second field strength which is smaller than the first field strength, wherein a setpoint length of the piezo stack is defined as a function of the second field strength. The driving arrangement is further designed to monitor a deviation, which is caused by depolarization, from the setpoint length of the piezo stack. Furthermore, when a prespecified threshold value for a change in length is reached, the driving arrangement is designed to operate the piezo stack at a third field strength until its setpoint length is reached.

Some embodiments are based on the insight that operation of the piezo actuator at a higher field strength than the field strength which is used for polarization results in a "repolarization effect" which leads to greater orientation of the domains. This ensures lengthening of the depolarized piezo stack, so that said piezo stack can be returned to its setpoint length.

The disclosed method allows active zero position correction of the piezo stack. One advantage is that, in contrast to the solutions which are known from the prior art, no hydraulic compensation of play is necessary in order to ensure movement compensation in order to avoid an idle movement. Expensive, complicated bipolar circuits which ensure the zero point position in known solutions can likewise be dispensed with. In contrast to pure adaptation methods, as are used in the prior art, the disclosed method proposes an actual, physical correction of the zero point position. One advantage is that the design of the injector, in which the piezo stack is operated as an actuating element, does not have to take into consideration shifts in the zero point position.

The shift in the zero point position can advantageously be corrected during regular operation of the injector.

In particular, the third field strength, which is used for the active change in length and therefore zero point correction, is greater than the second field strength. Further preferably, the third field strength is also greater than the first field strength.

According to a further embodiment, the piezo stack, after the prespecified threshold value is reached, is continuously operated at the third field strength until the actual length of the piezo stack corresponds to the setpoint length. In a corresponding manner, the driving is designed, in one development, to operate the piezo stack at the third field strength until the actual length of the piezo stack corresponds to the setpoint length.

In one embodiment of the method, the piezo stack is operated at the second field strength after its setpoint length is reached again. To this end, the driving is designed in a corresponding manner in one development.

According to a further embodiment, the setpoint length, which prespecifies a starting position of the piezo stack without driving, is determined by an idle stroke detection method.

In a further embodiment, the change in length is likewise determined by an idle stroke detection method. The driving is correspondingly designed to carry out an idle stroke detection method of this kind. An idle stroke detection method of this kind can be carried out, for example, as described in WO 2006/029931 A1.

Driving of a piezoelectric actuator having a piezo stack is based on the field strength VPol during the polarization process of the ceramic layers of the piezo stack and the field strength during operation of the piezo stack VOp generally being selected such that normal operation (or: regular operation) of the piezo stack, for example as an actuating element for an injector of an engine, leads to depolarization of its domains. This leads, like changes in temperature which occur, to certain shortening of the piezo stack.

FIG. 1 shows the lengths L0, L1 and L2 of a piezo stack 1 in different states ZS0, ZS1 and ZS2. The piezo stack 1 has a length L0 in the state ZS0 in which the piezo stack 1 is not polarized. The dipole moments of the ceramic layers are still oriented in a random manner in the state ZS0. The dipole moments are also called Weiss domains or domains. The length increases to L1 on account of the polarization process in which a field at a first electric field strength VPol is applied to the ceramic layers of the piezo stack 1 being carried out. In this case, the state ZS1, in which the piezo stack 1 has the length L1, represents a state in which the piezo stack is polarized and not yet operated. After the polarization (state ZS1), the dipole moments are oriented substantially in parallel.

State ZS2 shows the situation in which the piezo stack 1 is polarized and is operated at an electric field strength VOp which is smaller than the field strength VPol, as is usually the case during regular operation. This leads to depolarization, that is to say return orientation, of the dipole moments or domains. This results (over time) in an increasing reduction in the length, this being identified by L2 in ZS2 in FIG. 1.

Figure 2:
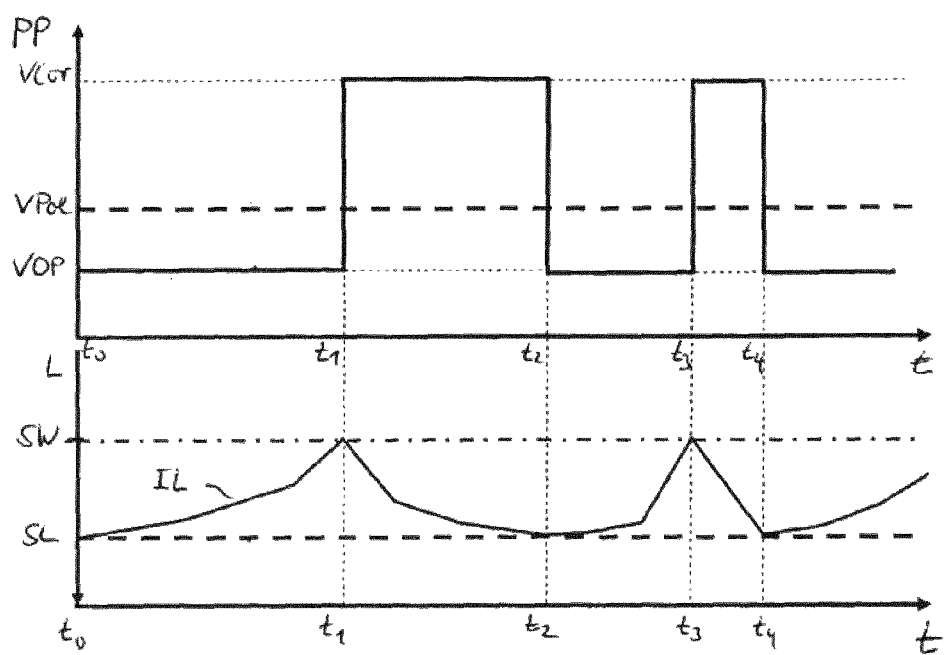
FIG. 2 shows a graph which illustrates the change in length of a polarized piezo stack as a function of different electric fields which act on said piezo stack.

This process can be seen more clearly in the graph of FIG. 2. A polarization parameter PP, such as the voltage which is applied to the piezo stack 1 or the resulting field strength for example, and the length L of the piezo stack are illustrated with respect to time t. It should be noted that, in the length/time graph of FIG. 2, the length L is greater toward the bottom and smaller toward the top.

Therefore, the profile of the electric field strength which is applied to the piezo stack is illustrated with respect to time in the upper graph.

In this case, the application can be performed, in particular, in the form of individual application pulses, and therefore the illustration in this case is to be understood as an illustration of the selected amplitudes of the drive pulses during the illustrated period of time.

The piezo stack has a setpoint length SL at a time t0. The piezo stack is operated at the field strength VOp between t0 and t1. This results in the above-describes change in length, that is to say shortening, which is shown by the actual length IL in the lower graph. The actual length IL reaches a prespecified threshold value SW for the change in length at time t1, and therefore active zero point correction is required. To this end, the piezo stack is continuously operated at a field strength VCor until time t2. By virtue of the field strength VCor being applied to the piezo stack, the depolarization can be reversed, and therefore the length of the piezo stack can be increased again. The actual length (actual length IL) has again reached the setpoint value SL at time t2. For this reason, the piezo stack can now be operated again at the field strength VOp, as a result of which the length of the piezo stack 1 is increased again. The change in length again reaches the prespecified threshold value at time t3, as a result of which the piezo stack 1 is again operated at the third field strength VCor until time t4.

As is readily shown in FIG. 2, the third field strength VCor which is used for the active zero point correction is greater than the second field strength VOp which is used during operation and the first field strength VPol which is used for the polarization process.

The setpoint length, that is to say the starting position of the length of the piezo stack 1, and the permissible change in length can be detected by means of known idle stroke detection methods.

An advantage of the described method is that the active zero point correction which is carried out according to the invention does not require hydraulic compensation of play. Similarly, expensive, complicated circuits which allow operation of the piezo stack with a reversed polarity can be dispensed with. In contrast to pure adaptation methods, an actual, physical correction of the zero point position is performed in the case of the procedure according to the invention. On account of this, the injector design does not need to take into consideration shifts in the zero point position. In particular, depolarization of a piezo stack over the course of time can also be reversed during regular operation of the fuel injector.

What is claimed is:

1. A method for driving a piezoelectric actuator for a fuel injector in a combustion engine, the piezoelectric actuator having a piezo stack having a setpoint length, the piezo stack, polarized during its production by a polarization process initially at a first field strength, the method comprising:

driving the piezo stack during a regular operation of the combustion engine at a second field strength that is smaller than the first field strength;
    monitoring a change in length of the piezo stack from the setpoint length of the piezo stack, the change in length being caused by depolarization during regular operation of the combustion engine; and
    in response to reaching a prespecified threshold value for the change in length of the piezo stack, operating said piezo stack at a third field strength until the setpoint length of the piezo stack is reached.

2. The method of claim 1, wherein the third field strength is greater than the second field strength.

3. The method of claim 1, wherein the third field strength is greater than the first field strength.

4. The method of claim 1, comprising in response to reaching the prespecified threshold value, continuously operating the piezo stack at the third field strength until the actual length of the piezo stack corresponds to the setpoint length.

5. The method of claim 1, further comprising, after operating said piezo stack at the third field strength until the setpoint length of the piezo stack is reached, operating the piezo stack at the second field strength.

6. The method of claim 1, wherein the setpoint length, which prespecifies a starting position of the piezo stack without driving, is determined by an idle stroke detection method.

7. The method of claim 1, comprising determining the change in length of the piezo stack by an idle stroke detection technique.

8. An arrangement for driving a piezoelectric actuator for a fuel injector in a combustion engine, the actuator comprising a piezo stack having a setpoint length, the piezo stack polarized during production by a polarization process initially at a first field strength, resulting in a first length of the piezo stack;

wherein the driving arrangement drives the piezo stack during regular operation of the combustion engine at a second field strength that is smaller than the first field strength;
    wherein the driving arrangement monitors a change in length of the piezo stack, the change in length being caused by depolarization; and
    wherein the driving arrangement, in response to reaching a prespecified threshold value for the change in length of the piezo stack, operates said piezo stack at a third field strength until its setpoint length of the piezo stack is reached.

9. The arrangement of claim 8, further configured to continuously operate the piezo stack at the third field strength until the actual length of the piezo stack corresponds to the setpoint length.

10. The arrangement of claim 8, further configured to, after operating said piezo stack at the third field strength until the setpoint length of the piezo stack is reached, operate the piezo stack at the second field strength.

11. The arrangement of claim 8, further configured to determine the setpoint length, which prespecifies a starting position of the piezo stack, by an idle stroke detection technique.

12. The arrangement of claim 8, further configured to determine the change in length of the piezo stack by an idle stroke detection technique.

13. A system, comprising:
    a piezoelectric actuator for a fuel injector of a combustion engine, the actuator comprising a piezo stack having a setpoint length, the piezo stack polarized during production by a polarization process initially at a first field strength, resulting in a first length of the piezo stack, and an arrangement for driving the piezoelectric actuator according to a process including:
  driving the piezo stack during a regular operation of the combustion engine at a second field strength that is smaller than the first field strength;
monitoring a change in length of the piezo stack caused by depolarization; and
in response to reaching a prespecified threshold value for the change in length of the piezo stack, operating said piezo stack at a third field strength until the setpoint length of the piezo stack is reached.

* * * * *